US012685193B2

(12) United States Patent
Pham et al.

(10) Patent No.: US 12,685,193 B2
(45) Date of Patent: Jul. 14, 2026

(54) ISOLATED METAL CLIPS WITH STRUCTURAL BRIDGE

(71) Applicant: Analog Devices, Inc., Wilmington, MA (US)

(72) Inventors: Hien Minh Pham, Fremont, CA (US); Melvin Sto Domingo Nava, Morgan Hill, CA (US); John David Brazzle, Tracy, CA (US)

(73) Assignee: Analog Devices, Inc., Wilmington, MA (US)

( * ) Notice: Subject to any disclaimer, the term of this patent is extended or adjusted under 35 U.S.C. 154(b) by 911 days.

(21) Appl. No.: 17/932,913

(22) Filed: Sep. 16, 2022

(65) Prior Publication Data

US 2024/0096775 A1      Mar. 21, 2024

(51) Int. Cl.
H05K 1/18          (2026.01)
G01R 31/28        (2006.01)
(Continued)

(52) U.S. Cl.
CPC ........ H10W 70/65 (2026.01); G01R 31/2884 (2013.01); H05K 1/181 (2013.01);
(Continued)

(58) Field of Classification Search
CPC .......... H01L 23/49838; H01L 23/3121; H01L 23/49811; H01L 23/49861; H01L 21/4825; H01L 21/4828; H01L 21/4839; H01L 21/565; H01L 21/56; H01L 2224/4001; H01L 2224/40095; H01L 2224/40145;
(Continued)

(56) References Cited

U.S. PATENT DOCUMENTS 9,935,041 B1 *   4/2018   Lopez ............... H01L 23/49541
10,497,635 B2   12/2019   Brazzle et al.
(Continued)

FOREIGN PATENT DOCUMENTS

DE        102022116833        1/2023

OTHER PUBLICATIONS

"German Application Serial No. 102023121760.7, Office Action mailed Nov. 27, 2024", w/ English machine translation, 10 pgs.
(Continued)

*Primary Examiner* — Roshn K Varghese
(74) *Attorney, Agent, or Firm* — Schwegman Lundberg & Woessner, P.A.

(57)          ABSTRACT

Methods, and systems, are presented for a Structural Bridge for Electrically Isolated Metal Clips by mounting on a substrate a first and a second circuit. These first and second circuits can include Component on Package (CoP) electronic parts that are electrically contacted to the substrate with metal clips mounted on the surface of the substrate. The metal clips are electrically connected to respective circuit first and second circuits by an electrical connection on or in the substrate. The metal clips are folded over the respective first and second circuits. The folded-over portion of the first metal clip and the folded-over portion of the second metal clip are electrically isolated from each other. A third circuit package that is mounted on and electrically connected to a folded-over portion of the first metal clip and to a folded-over portion of the second metal clip.

19 Claims, 9 Drawing Sheets

(51) Int. Cl.

| | |
|---|---|
| *H05K 1/181* | (2026.01) |
| *H10W 70/04* | (2026.01) |
| *H10W 70/40* | (2026.01) |
| *H10W 70/65* | (2026.01) |
| *H10W 74/01* | (2026.01) |
| *H10W 74/10* | (2026.01) |
| *H10W 90/00* | (2026.01) |
| *H10W 72/00* | (2026.01) |
| *H10W 72/60* | (2026.01) |

(52) U.S. Cl.

CPC ....... *H10W 70/041* (2026.01); *H10W 70/042* (2026.01); *H10W 70/047* (2026.01); *H10W 70/479* (2026.01); *H10W 74/016* (2026.01); *H10W 74/114* (2026.01); *H10W 90/00* (2026.01); *H10W 90/701* (2026.01); *H10W 72/07652* (2026.01); *H10W 72/07653* (2026.01); *H10W 72/07654* (2026.01); *H10W 72/621* (2026.01); *H10W 72/647* (2026.01); *H10W 90/762* (2026.01)

(58) Field of Classification Search

CPC ... H01L 2224/4112; H05K 1/18; H05K 1/181
See application file for complete search history.

(56) References Cited

U.S. PATENT DOCUMENTS 11,272,618 B2    3/2022   Brazzle et al.

| | | | |
|---|---|---|---|
| 2010/0149773 A1* | 6/2010 | Said | H01L 23/49575 |
| | | | 257/676 |
| 2013/0249051 A1 | 9/2013 | Saye | |
| 2017/0311447 A1 | 10/2017 | Brazzle et al. | |
| 2019/0304865 A1 | 10/2019 | Brazzle et al. | |
| 2020/0152614 A1 | 5/2020 | Brazzle et al. | |
| 2020/0251409 A1* | 8/2020 | Saito | H01L 23/49541 |
| 2021/0082790 A1 | 3/2021 | Zhang et al. | |
| 2021/0111084 A1 | 4/2021 | Brazzle et al. | |
| 2023/0171894 A1* | 6/2023 | Norell | H05K 1/181 |
| | | | 174/250 |

OTHER PUBLICATIONS

"German Application Serial No. 102023121760.7, Response filed Feb. 6, 2025 to Office Action mailed Nov. 27, 2024", 77 pgs.

"µModule Power Products", Analog Devices, Inc., (2018), 32 pgs.

"LTM4638: 20VIN, 15A Step-Down DC/DC µModule Regulator", Analog Devices, Inc., (2021), 30 pgs.

"LTM4664: 54VIN Dual 25A, Single 50A µModule Regulator with Digital Power System Management", Analog Devices, Inc., (2022), 140 pgs.

"LTM4678: Dual 25A or Single 50A µModule Regulator with Digital Power System Management", Analog Devices, Inc., (2019), 124 pgs.

"LTM4700: Dual 50A or Single 100A µModule Regulator with Digital Power System Management", Analog Devices, Inc., (2021), 126 pgs.

* cited by examiner

ISOLATED METAL CLIPS WITH STRUCTURAL BRIDGE

TECHNICAL FIELD

The subject matter disclosed herein generally relates to methods and apparatuses for connecting Component on Package (CoP) circuits in 3D structures, specifically for using isolated metal clips for connecting multiple CoP electrical components.

BACKGROUND

To reduce the size of an electrical system, electronic circuit packages can be stacked on top of each other. The bottom package can include bottom terminals for being soldered to a printed circuit board. The bottom package can include top terminals for being soldered to the terminals of the upper package. The bottom package can be fabricated with vias, which are fabricated by laser etch process, leading from its top terminals to internal circuitry or the bottom terminals on the bottom package. These vias allow for vertical interconnects between the substrate and other electrical circuits above the substrate but have a complicated fabrication process which that is time consuming. This type of stacked circuit design can be referred to as a 3-dimensional (3D) package. However, there can be issues, such as large resistance because of the size and shape of the vias or related to the use of solder wicking at the vertical interconnects. Such issues can pose problems when using prefabricated Component on Package (CoP) electronics as part of the 3D design.

SUMMARY

The present inventors have recognized, among other things, that methods and apparatuses are needed to reduce resistance through the connectors while not increasing the complexity of the design.

This document describes methods and apparatuses for Component on Package (CoP) methods and apparatus. Prefabricated integrated device packaging, including multiple components, can be electronically mounted on a substrate. In order to save on the overall footprint of a device, a second prefabricated integrated device package can be connected such that it is mounted above the first prefabricated integrated device packaging while providing electronic connections to the first integrated device packing or the substrate as needed.

In some aspects, the techniques described herein relate to an apparatus that can include a substrate and multiple circuit packages placed on the substrate. A first circuit package can be mounted to the first surface of the substrate. A first metal clip can be mounted on the first surface of the substrate and electrically connected to the first circuit package via a first electrical connector on or in the substrate and folded over the first circuit package. A second circuit package can be mounted on the first surface of the substrate. A second metal clip can be mounted on the first surface of the substrate and electrically connected to the second circuit package via a second electrical connector on or in the substrate. The second metal clip can be folded over the second circuit package. A third circuit package can be mounted on the metal clips to be electrically connected at a folded-over portion of the first metal clip and a folded-over portion of the second metal clip. The folded-over portion of the first metal clip and the folded-over portion of the second metal clip can be electrically isolated from each other.

In some aspects, the techniques described herein can relate to an apparatus, further including a first end of dielectric support connected to one end of the folded-over portion of the first metal clip and an opposite second end of the dielectric support connected to the folded-over portion of the second metal clip, the dielectric support providing electrical isolation and bridging mechanical support between the first and second metal clips.

In some aspects, the techniques described herein can relate to an apparatus wherein the dielectric support is connected to an underside of the folded-over portion of the first and second metal clips that face the substrate.

In some aspects, the techniques described herein can relate to an apparatus wherein the third circuit package is electrically connected to both the first metal clip and the second metal clip.

In some aspects, the techniques described herein can relate to an apparatus, wherein the third circuit package includes an inductor or coil.

In some aspects, the techniques described herein can relate to an apparatus, wherein an insulating transfer molding material is layered over the first circuit package and the second circuit package and under the first metal clip and second metal clip.

In some aspects, the techniques described herein can relate to an apparatus, wherein the bend angle of the folded-over portion of the first metal clip and the second metal clip is between 80° to 90°.

In some aspects, the techniques described herein can relate to an apparatus, further including a third metal clip mounted on the first surface of the substrate and electrically connected to a substrate ground via a third electrical connector on or in the substrate. The folded-over portion of the third metal clip can be equal in height to the folded-over portions of the first and second metal clips, and the ground of the third circuit package can be electrically connected to the substrate ground via the folded-over portion of the third metal clip. The folded-over portion of the third metal clip can be electrically isolated from the first metal clip and the second metal clip.

In some aspects, the techniques described herein can relate to an apparatus, wherein the first metal clip is connected to an input terminal of a third circuit package, wherein the third circuit package is a first voltage or current regulator and bypasses the first circuit package, wherein the first circuit package is a second voltage or current regulator; the second metal clip provides an electrical path to output the regulated voltage or current from a first regulator to a second voltage or current regulator that is attached to the substrate surface. t In some aspects, the techniques described herein can relate to an apparatus, wherein the third circuit package is a voltage regulator.

In some aspects, the techniques described herein can relate to an apparatus, wherein multiple circuit package are a part of a voltage regulator mounted to the sub state's first surface.

In some aspects, the techniques described herein can relate to an apparatus wherein the folded-over portion of at least one of the first or the second metal clips includes a Kelvin sense measurement lead connected at one end to the folded-over portion at a location away from current flow through the folded-over portion and the third circuit package.

In some aspects, the techniques described herein can relate to an apparatus, wherein the Kelvin sense measurement lead is voltage or current measurement lead.

In some aspects, the techniques described herein can relate to an apparatus wherein the measurement lead is configured to connect to inductor current measurement circuitry to measure an inductor current of an inductor in the third circuit package.

In some aspects, the techniques described herein can relate to a method of manufacturing a packaged electronic component, the method including: connecting as a unitary component one or more metal clips by using one or more lead frames that connect a plurality of connector pads of the one or more metal clips; and placing the one or more metal clips connected by one or more lead frames on respective contact pads on or in a substrate connecting at least a first circuit package.

In some aspects, the techniques described herein can relate to a method further including: injecting using a transfer molding process a molded layer over the substrate and the first circuit package, wherein the molded layer leaves a topside of the one or more metal clips exposed for contact; removing portions of the one or more lead frames from the one or more metal clips; and placing a second circuit package on the topside of the one or more metal clips.

In some aspects, the techniques described herein can relate to a method, wherein removing includes mechanically sawing portions of the one or more lead frames to provide electrical isolation to the one or more metal clips.

In some aspects, the techniques described herein can relate to a method, wherein the one or more metal clips include one or more holes in the portion connected to the substrate and on the folded-over portion to increase flow of the molded layer, reduce air pockets, and to provide better grip to the metal clips.

In some aspects, the techniques described herein can relate to a method, further including: masking the topside of the folded-over portion of the metal to have expose portion of the topside of the one or more metal clips by and chemical etching or other etching methods such as stripping or grinding, to create a structural step for a molded layer to hold the metal clip in place physically and provide structural support.

In some aspects, the techniques described herein can relate to a method, wherein injecting a mold using a transfer mold method the molded layer includes positioning the packaged electronic component so that the legs of the metal clips do not impede the flow direction of the molded layer.

BRIEF DESCRIPTION OF THE DRAWINGS

Various of the appended drawings merely illustrate example embodiments of the present disclosure and cannot be considered as limiting its scope.

DETAILED DESCRIPTION

Component on Package (CoP) methods and apparatus are presented, which can include metal clips for electrical pathways for stacked integrated circuits or other 3D circuit designs. The present techniques can provide improvements that can help reduce the resistance of the electrical pathways through mold slotted via (TMSV) solder gap and can help reduce solder wicking. The methods and apparatuses shown can have the added benefit of helping improve thermal performance as the metal clips can act as a heat spreader. The present metal clip techniques can also help reduce power loss for high current operations. The present techniques can accommodate standard surface mount electrical components such as a prefabricated inductor or other prefabricated electronic component. There would be no need to redesign the electrical component, and off-the-shelf components may be integrated into more complex circuit designs. The metal clips can be positioned to connect the bottom prefabricated components to the substrate.

The metal clips that act as electrical pathways for the 3D circuit design, as described, have versatile uses. Various embodiments can be customized in terms of length, width, and angle of the fold of the metal clips. The present techniques can also allow the thickness of the metal clip to be better controlled in the fabrication process of the metal clips. Therefore, the present techniques can help reduce power loss over the connectors between electrical components.

If desired, the metal clips can be fabricated to include an electrical pathway for a four-terminal or Kelvin sensor, such as which can provide a current output for readout.

Figure 1:
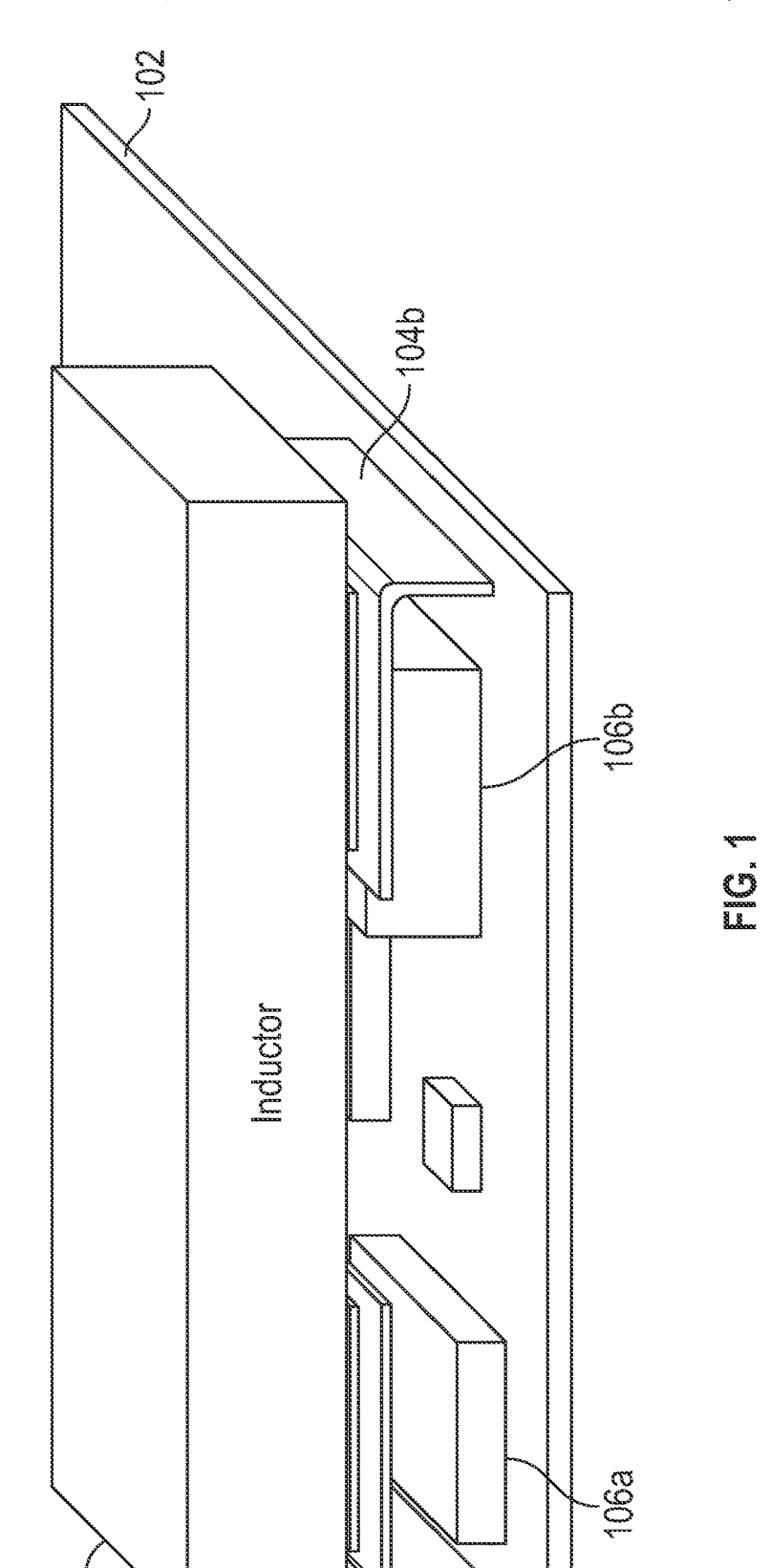
FIG. 1 shows an example device structure using metal clips to make a 3D structure with pre-packed components according to some embodiments.

FIG. 1 shows an example of a device structure using metal clips to make a 3D structure with pre-packaged components. The 3D structure can comprise any number of circuit package for simplicity FIG. 1 shows an example configuration using four metal clips including a first metal clip 104*a* and second metal clip 104*b*. A first circuit package 106*a* made from a group of one or more prefabricated electronic components mounted to the first surface of substrate 102. The first metal clip 104*a* can be mounted on the first surface of substrate 102 and electrically connected to the first circuit package via a first electrical connector on or in the substrate and folded over the first circuit package 106*a*. A second circuit package 106*b* can be mounted on the first surface of substrate 102. A second metal clip 104*b* can be mounted on the first surface of substrate 102 and electrically connected to the second circuit package 106*b* via a second electrical connector on or in substrate 102 and folded over the second circuit package 106*b*. A third circuit package 108 can be mounted on and electrically connected to a folded-over portion of the first metal clip 104*a* and a folded-over portion of the second metal clip 104*b*. While a first metal clip 104*a* and a second metal clip 104*b* are discussed above, variations can include more metal clips in a similar configuration and relationship as the first metal clip 104*a* and the second metal clip 104*b*.

In some examples, there is only one contact point per pin for the third circuit package 108 that has an electrical path through metal clips 104*a* and 104*b* to either first or second circuit package 106*a*, 106*b*. In other examples, the third circuit package 108 is electrically connected to both the first metal clip 104*a* and the second metal clip 104*b*. Also, the folded-over portion of the first metal clip 104*a* and the folded-over portion of the second metal clip 104*b* can be spaced apart and electrically isolated from each other. This can help the 3D structure take up less space on the substrate 102.

The third circuit package 108 can include one or multiple different types of electrical components, for example, such as an inductor or a coil. If desired, the third circuit package can be a duplicate of either the first or second component on package 106*a* or 106*b*.

Metal clips 104*a* or 104*b* are electrically connected to the surface of the substrate 102. The folded-over portion of the metal clips 104*a*, and 104*b* can make electrical contact with one or more connection pads on the bottom of the third circuit package 108. A bend angle of the folded-over portion of either the metal clips 104*a* and 104*b* can range from 80° to 90° for the angle between the vertical interconnect portion and the folded-over portion of the metal clips 104*a*, and 104*b*.

Solder wicking can affect a 3D circuit design. When the solder heats up during a reflow process or during processes where there is exposure to heat up to 280° C., liquified solder can climb up the conducting pathway (e.g., along a vertical wall or crevice provided by a metal clip) and away from the substrate. Solder wicking can increase connection resistance or even break a desired electrical connection between the conducting pathway and the substrate. Solder wicking can be reduced or avoided using the present techniques, such as by molding over the metal clip with an electrically insulating overmold material, which can help electrically isolate the metal pathway and mechanically hold or lock the metal clip in place.

For example, an electrically non-conductive molding material can be layered over the first circuit package 106*a* and over the second circuit package 106*b* and under the first metal clip 104*a* and second metal clip 104*b*. This can help to provide both structural support and electrical isolation. Since the first circuit package 106*a* and the second circuit package 106*b* may be of different sizes, including different heights, the molding material can fill the air gap (e.g., between overlying and underlying components). This can help provide structural support to the device. This can also help provide extra electrical isolation between components.

Figure 2A:
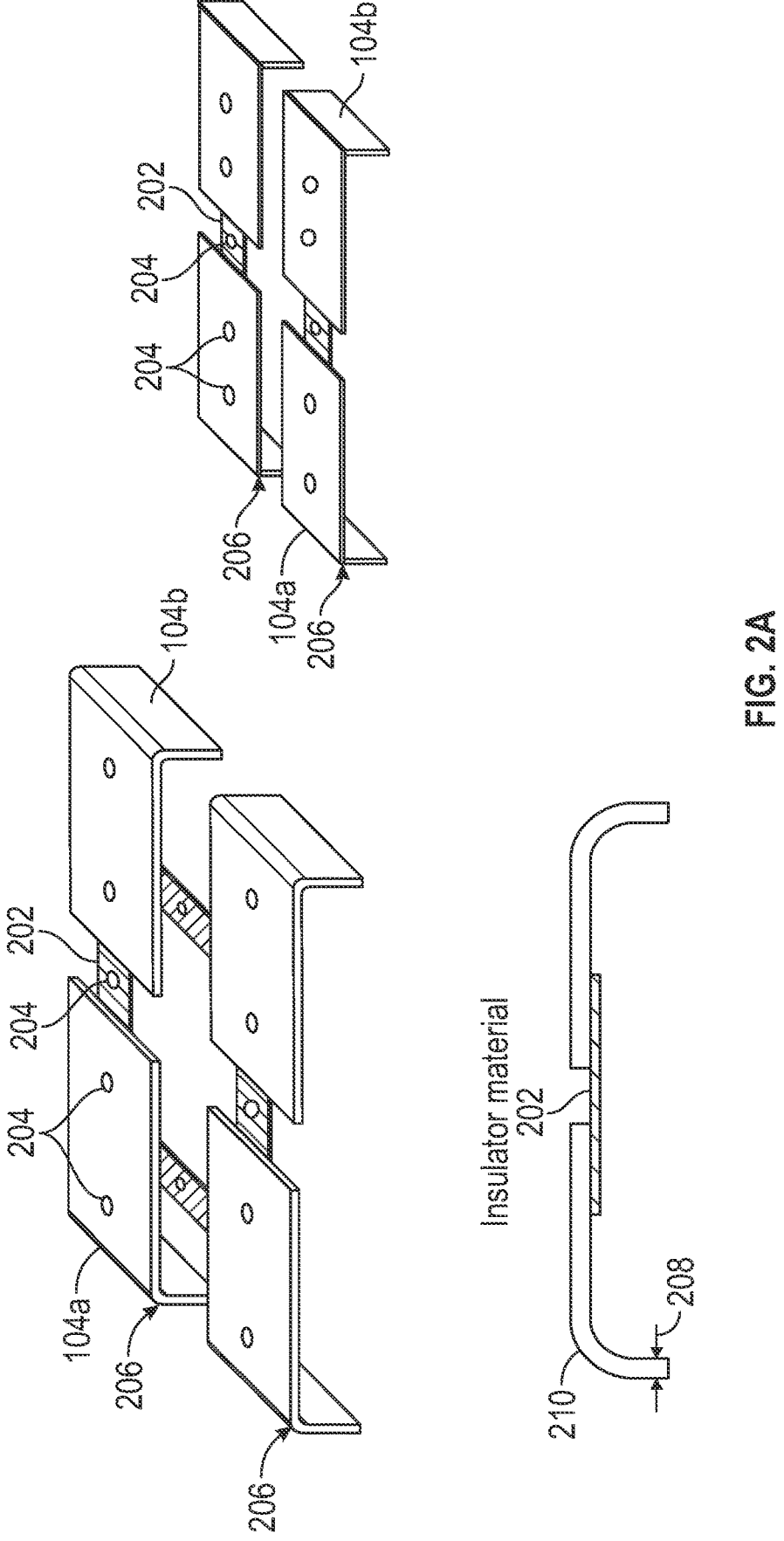
FIG. 2A shows a top view of a design for support structures for use with metal clips.
Figure 2B:
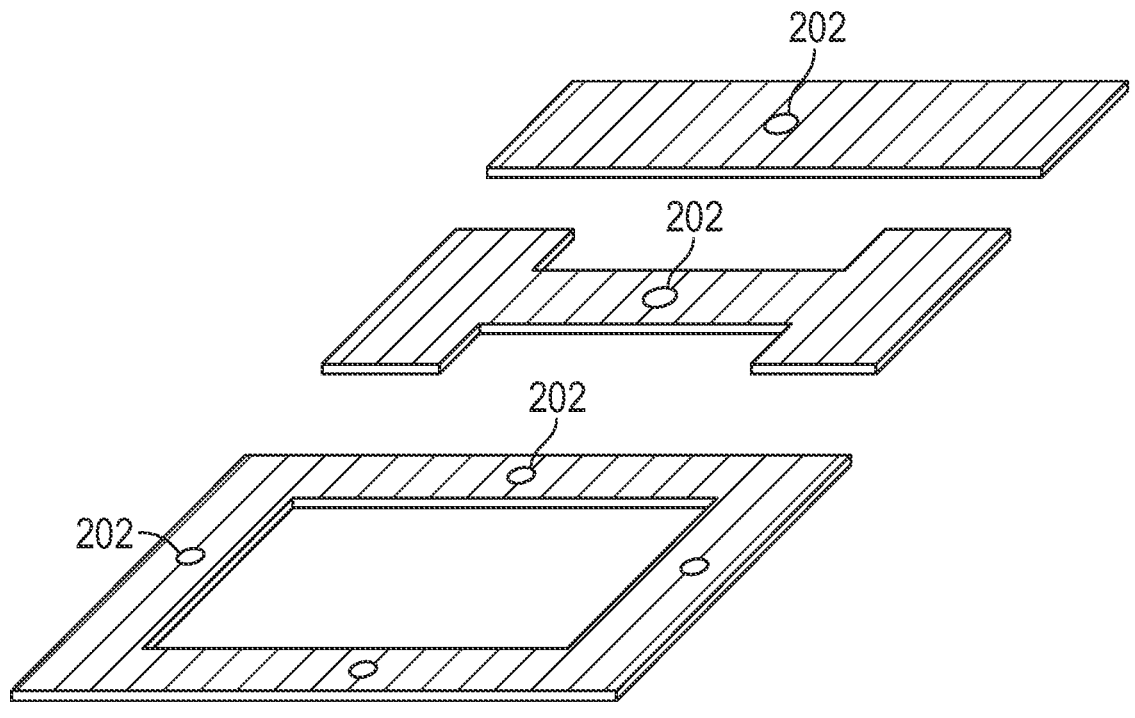
FIG. 2B shows multiple designs for the dielectric support structures which can be used with the metal clips.

FIG. 2A and FIG. 2B show a top view of examples of support structures that can be used with the metal clips 104*a* and 104*b*.

For example, a dielectric support structure 202 can include a first end and a second end. The first end of the dielectric support structure 202 can be connected to one end of the folded-over portion of the first metal clip 104*a*. An opposite second end of the dielectric support structure 202 can be connected to the folded-over portion of the second metal clip 104*b*. The connection of the dielectric support structure 202 to the folder-over portions of the metal clips 104*a* and 104*b* can be done by using an insulating glue to adhere the support structure at the points it connects with the fold-over portion or by other similar methods. In this way, the dielectric support structure 202 can provide electrical isolation and bridging mechanical support between the first and second metal clips 104*a*, 104*b*. A bend angle 506 of the folded-over portion of either the metal clips 104*a* and 104*b* can range from 80° to 90° for the angle between the vertical interconnect portion and the folded-over portion of the metal clips 104*a*, and 104*b*. In order to obtain this bend angle 506 the radius of the bend 510 (R) is twice the thickness 508 (T) of the material of the metal clips 104*a* and 104*b*.

In FIG. 2B, the length and other dimensions, materials, or other features of the dielectric support structure 202 can be adjusted, such as to help support the size of the third circuit package 108. The dielectric support 202 can be made of any non-electrically-conducting material, such as a thin-film material (i.e., FR4, Garolite, Fiberglass GPO3, or similar material).

The metal clips 104*a* and 104*b* can optionally include mold-flow holes 204. Any number of similar or differently sized mold-flow holes 204 can also be included in the dielectric support 202. When a flowable molding material is injected over the componentry, such mold-flow holes 204 can help provide receptacles to receive and attach to such molding material to help provide structural support and electrical isolation. The mold-flow holes 204 can also help to obtain an even coating of the molding material that is layered over the first circuit package 106*a* and over the second circuit package 106*b* and under the first metal clip 104*a* and second metal clip 104*b*. The one or more metal clips 104*a* and 104*b* can include one or more holes 204 in the vertical portion connected to substrate 102, on the folded-over portion of the metal clips 104*a* and 104*b*, or both. Such mold-flow holes 204 can help to increase the flow rate of the molded layer and reduce air pockets during transfer molding.

The mold-flow holes 204 can include through holes that fully penetrate and extend through the thickness of the metal clips 104*a* and 104*b* to help the molding compound freely flow through the mold-flow holes 204. The orientation and hole size of the multiple mold-flow holes 204 to avoid increasing the electrical resistance if multiple mold-flow holes 204 are arranged perpendicular to the current flow.

Figure 3:
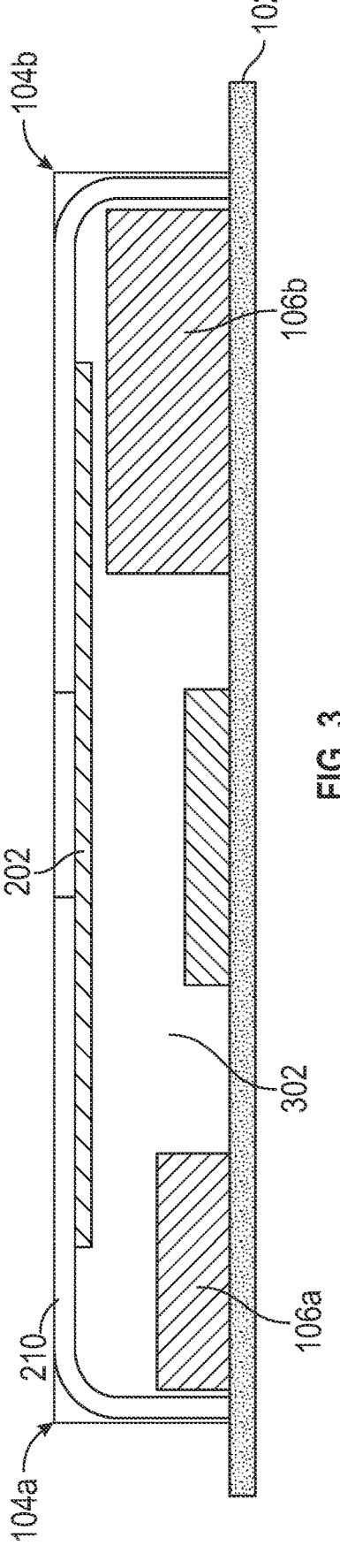
FIG. 3 shows a side view of a device structure using the metal clips design with added support structures under the metal clips.

Along with having through holes for allowing for mold-flow the edges of the metal clips 104*a* and 104*b* are selectively etched (half-etch) on the edges to provide a step. The half-etch of the metal clips 104*a* and 104*b* to let mold compound flow over and grip on the clip once solidified. FIG. 3 shows a side view of a device structure using the metal clips 104*a*, 104*b*. Support structures under the metal clips 104*a*, 104*b* can be provided by the molding material after flowing and curing, such as for covering the first and second circuit packages 106*a* and 106*b*. The bridge dielectric support structure 202 and a cured molding material 302 can be connected to the underside of the folded-over portion of the first and second metal clips 104*a* and 104*b* that faces the substrate 102.

To help avoid air gaps near the folded corners of the metal clips 104*a* and 104*b* or around the circuit packaging 106*a* and 106*b* or other components on the substrate 102, the legs of the metal clips 104*a*, 104*b* can be positioned such as to unimpede the flow direction of the uncured mold flow material.

Figure 4:
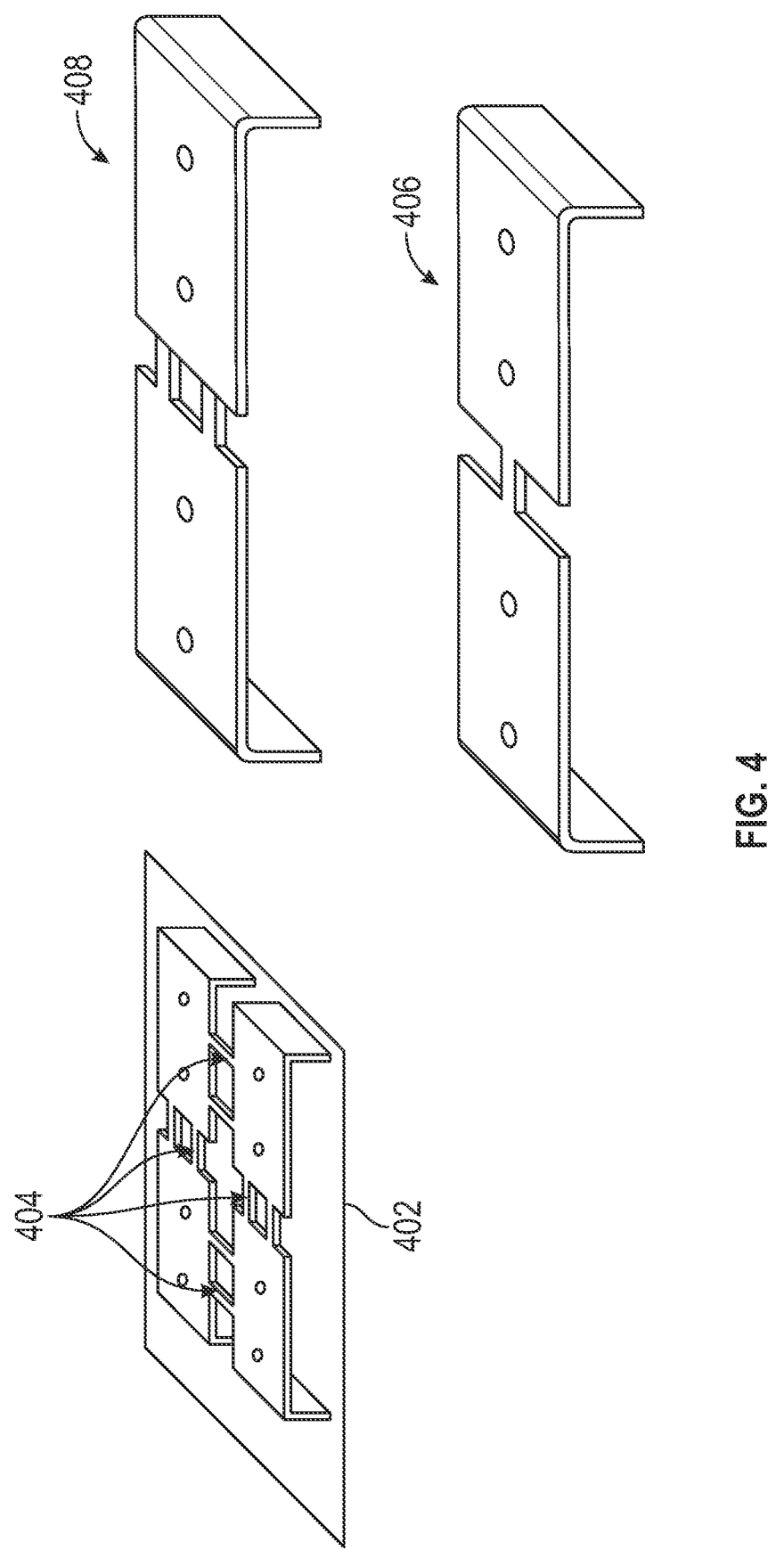
FIG. 4 shows a design for fabricating the metal clips using a lead frame construction.

FIG. 4 shows an example for fabricating the metal clips 104 using a lead frame construction or other similar module of multiple metal clips that can be configured as a unitary component arrangement of metal clips 402, such as metal clips 104*a* and 104*b*. Individual ones of the metal clips 402 can be connected to other individual ones of the metal clips 402, such as at predefined distances from each other. These can connected either by a single tie-bar structure as in the arrangement of metal clips 406 or a double tie-bar structure as in the arrangement of metal clips 408. For example, the lead frame can include tie-bars 404 that can be made of the same material as the metal clips 104*a*, 104*b*. The lead frame of multiple clips 402 may be fabricated as a unit. This unit may be made from the same material as the metal clips 104*a*, 104*b*. The unitary lead frame can then be positioned or assembled with respect to one or more other components. Transfer molding or other suitable fabrication processes can be used in such fabrication or assembly. Then, a material removal technique, such as wet or dry etching, can be selectively performed, such as using photolithographic or other techniques. The tie bars 404 can be selectively severed, such as to remove electrical conduction pathways along the tie-bars 404.

Figure 5:
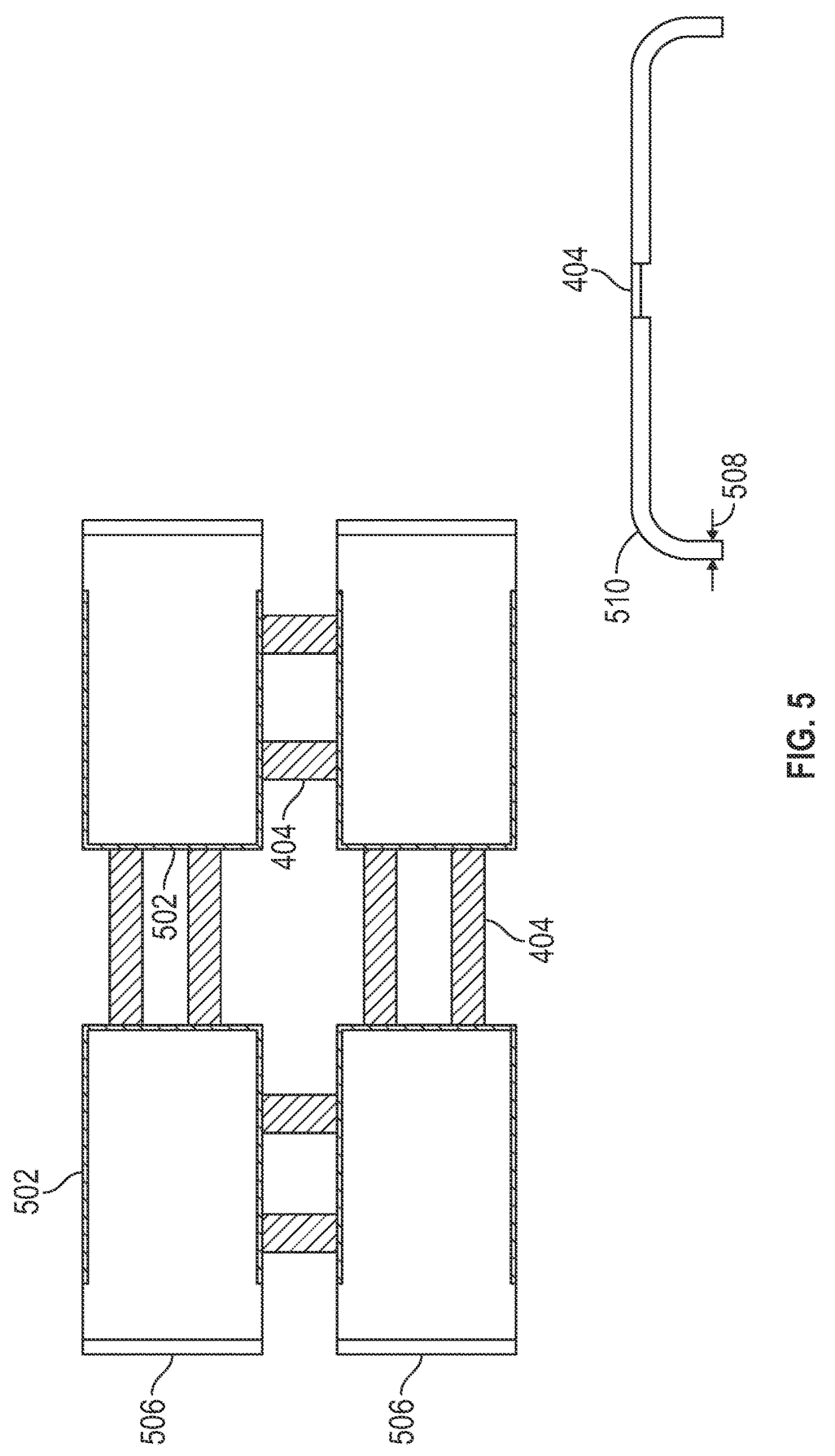
FIG. 5 shows a top view of the metal clips using lead frame construction using a dual bridge.
Figure 6:
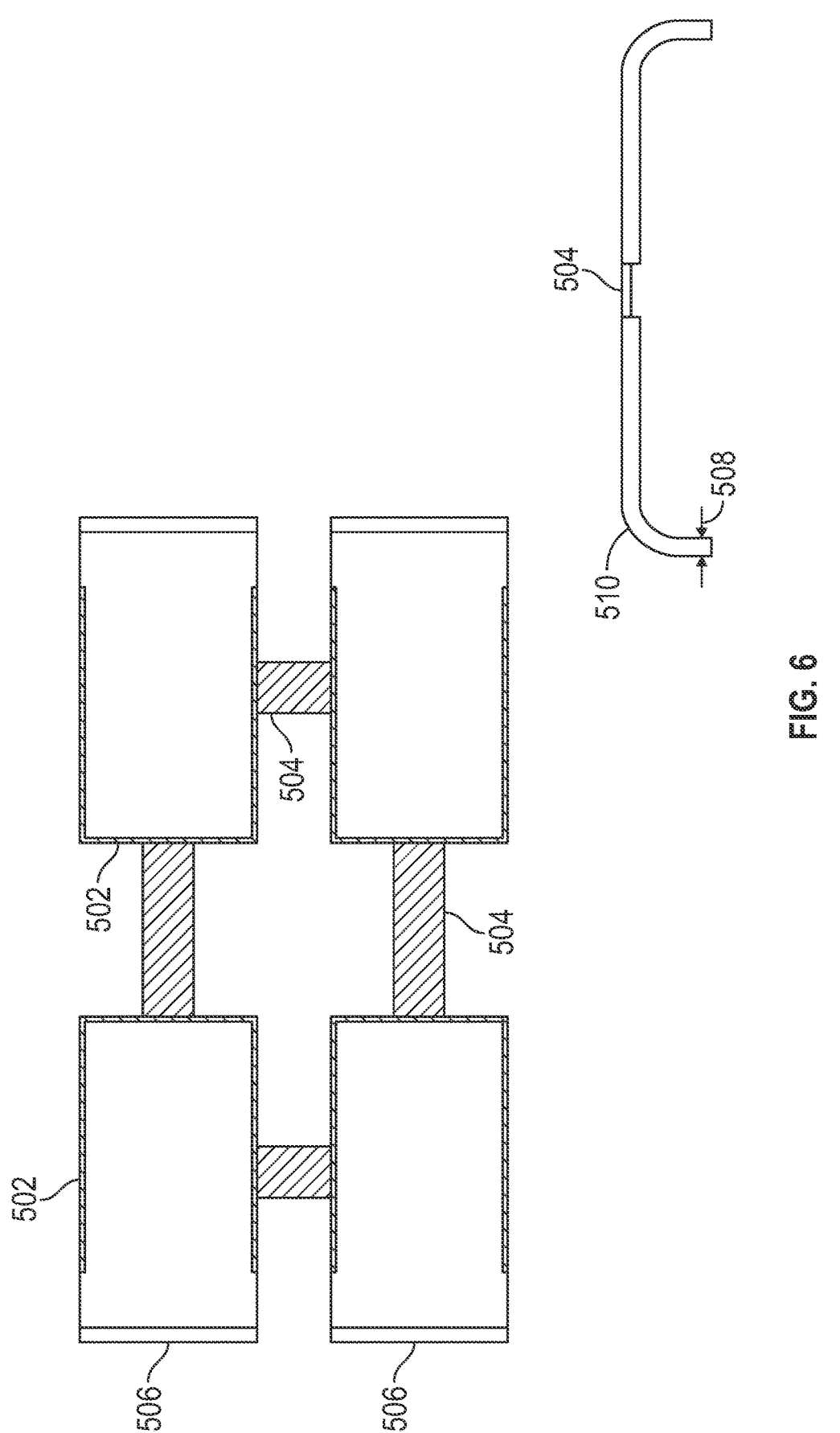
FIG. 6 shows a top view of the metal clips using lead frame construction using a single bridge.

FIG. 5 and FIG. 6 shows a top view of the metal clips using lead frame construction using a dual bridge and single bridge design respectively. The sideview shows that the thickness of the tie-bars 404, while being the same material as the metal clips are not the same thickness of the metal clips. For example, the thickness of the tie-bars 404 can be about half of that of the metal clip 104. Then, obtaining the tie-bar 404 thickness can be done by a material removal method such as wet or dry chemical etching can be used to selectively remove the tie-bars 404 of the lead frame. This can be done such that the tie-bars are etched along the bottom side 404 of the metal. Such selective etching (i.e. half-etch process) can include using photolithographic or other techniques, such as selectively etching the tie bars 404. The resulting lead frame, which may have been initially made at the same thickness as the metal clips 104*a* and 104*b*, may be reduced in thickness by about half. The bend angle 206 of the folded-over portion of either the metal clips 104*a* and 104*b* can range from 80° to 90° for the angle between the vertical interconnect portion and the folded-over portion of the metal clips 104*a*, and 104*b*. In order to obtain this bend angle 206 the radius of the bend 210 (R) is twice the thickness 208 (T) of the material of the metal clips 104*a* and 104*b*.

Along with selectively etching the tie-bars 404, the top-side of the folded-over portion of the metal clips on the unitary lead-frame 402 component, including the metal clips 104*a*, 104*b*, can also be masked off and selectively etched the edges of the metal clips creating a structural step 502. The structural step 502 allows for the mold flow material to mechanically hold the metal clips 104*a* and 104*b* in place. Such a structural step 502 at the edge of the metal clips 104*a*, 104*b* can be helpful during a subsequent fabrication process step, such as during transfer molding.

For example, an assembly method can include providing or obtaining the metal clips being connected via tie-bars 404, which can be carried as a unitary "lead frame" 402 that connects a plurality of metal clip connector pads. The unitary lead frame 402 includes component of metal clips 104*a* and 104*b* and may include at least two other metal clips can then be placed on and electrically connected to the substrate 102, such as for electrically connecting the circuit packages 106 via the metal clips and interconnections made within the substrate 102.

The unitary lead frame 402 may be fabricated as a unit, then assembled with the substrate 102 or other components. During molding, the structural step can provide a structural element that is easier for a mold flow material to be able to physically attach to the metal clips 104*a*, 104*b*. Since the lead frame is either etched or cut away by that point, the structural step the edge of the metal clips 104*a*, 104*b* helps provide further support and holds the metal clips 104*a*, 104*b* in place on the substrate 102.

The lead frame, including and carrying the metal clips 104*a* and 104*b*, can be placed on the substrate 102. The lead frame can be placed such that the folded-over portions of the metal clips 104*a* and 104*b* can be located over the surface-mounted electrical components at the connector pads. Then, the tie-bars 404 can be removed to create electrical isolation between the individual metal clips, at least at regions above the substrate 102. This can include mechanically sawing or otherwise removing portions of the tie-bars 404 of the lead frame, thereby transforming the unitary lead frame 402 component into individuated metal clips 104*a*, 104*b*.

The transfer molding process can be performed before (or after) the tie-bars 404 are cut. For example, a molding layer can be injected over the substrate 102 and the first circuit package 106 such as to help provide additional structural support. The molded layer formed by the transfer molding can leave the top side of the metal clips exposed, such as for electrical contact with the third circuit, package 108.

Figure 7:
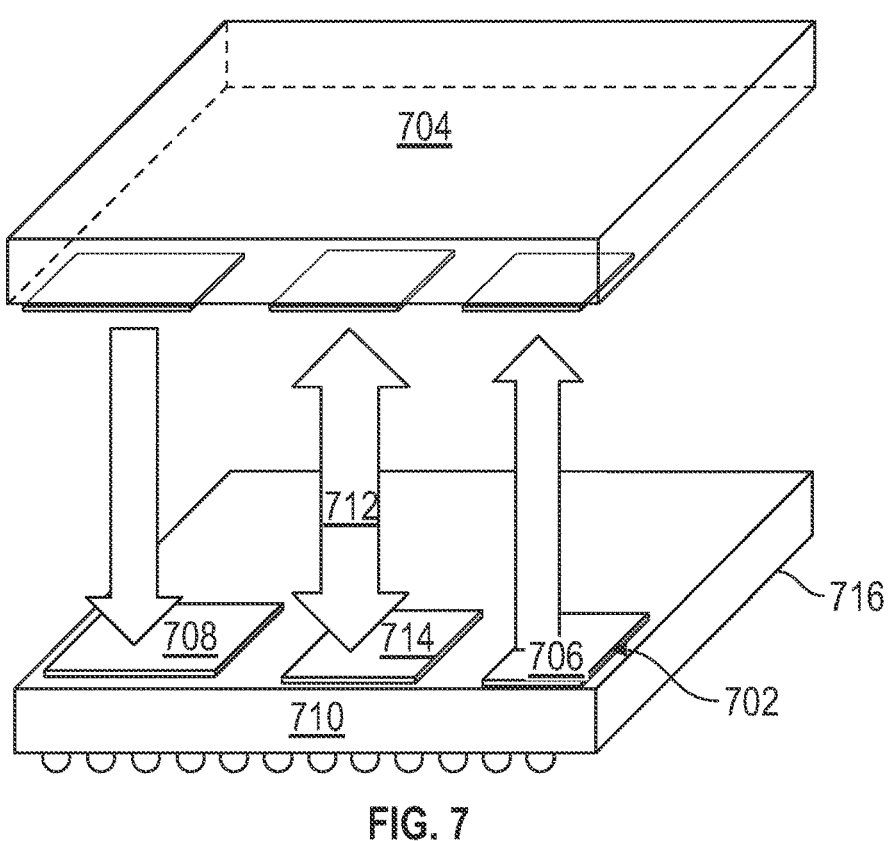
FIG. 7 shows an example stacking design for use with pre-packed electronic components according to another embodiment.

FIG. 7 shows an example of a stacking approach, such as for use with pre-packaged electronic components. For example, this stacking approach can help for providing a compact footprint for power converters or other componentry, such as to step-up or boost low Vin inputs or to step-down or buck high Vin inputs. This approach can be used without any changes needed for the internal components of the pre-packaged electronic circuit components. The metal clips 706, 708, and 714 can be placed as desired, such as to connect a bottom region of pre-packaged electronic circuit components to the substrate 102.

The overlaying third circuit package 108 can include a voltage regulator 704. The first metal clip 706 can be electrically connected to a voltage terminal of the first voltage regulator 704 to the first metal clip 706. The output of the output of the voltage regulator 704 is then used as an input which is provided to the second voltage regulator 710 by an electrical pathway through the second metal clip 708 can provide an electrical path for providing the input voltage to the second circuit package 710 and provide an output voltage at 716. This would bypass electrical components that are mounted on the substrate.

A third metal clip 714 can be mounted on the first surface of the substrate 102. The third metal clip 714 can be electrically connected to a ground line in the substrate 102, such as via a third electrical connector on or in substrate 102. The folded-over portion of the third metal clip 714 can be equal in height to the folded-over portions of the first and second metal clips 706 and 708. The ground terminal of high voltage regulator 704 can be electrically connected to a ground terminal of the substrate 102, such as via the folded-over portion of the third metal clip 714. At locations above the substrate 102, the folded-over portion of the third metal clip 714 is electrically isolated from the first metal clip 706 and the second metal clip 708.

For an illustrative example, an input voltage of 60 volts can be stepped down to 1 volt in a two-step configuration that can use pre-packaged components to first step down the voltage from 60 volts to an intermediate voltage of 5 volts and then to further step down the intermediate voltage of 5 volts down to a 1 volt output. In FIG. 7, the input 702 of the package can receive the 60V input voltage. Using a buck configuration, the 60 volt input voltage received at the input 702 can be electrically connected and provided to the pre-packaged components of the high voltage regulator 704 resting on the first metal clip 706. The high voltage regulator 704 can convert the 60V input voltage received at the input 702 to a 5 V output voltage at the second metal clip 708. The 5V output voltage at the second metal clip 708 can be electrically connected back down to a low voltage regulator 710 via the second metal clip 708 to provide and output voltage at 716. A common electrical ground connection 712 between the high voltage regulator 704 and the low voltage regulator 710 can be provided through an electrical connection therebetween that can be provided by the third metal clip 714. This common ground connection 712 can optionally also be electrically connected to a ground line of the substrate 102.

The circuit packages 704 and 710 can additionally or alternatively include current regulators or other first and second circuits used in a two-step power conversion or other processes, for example, using any combination of voltage or current buck, boost, or buck-boost converters for providing two-stage power conversion between first and second power terminals.

Figure 8:
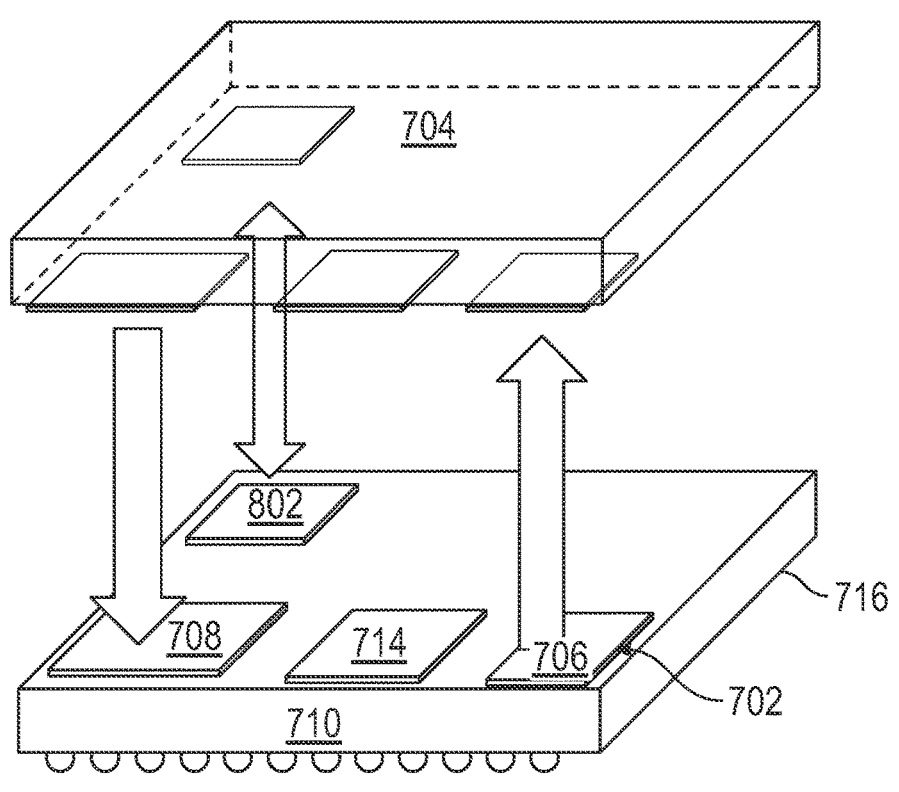
FIG. 8 shows an example stacking design for use with pre-packed electronic components with isolated grounds according to another embodiment.

FIG. 8 shows an example stacking design for use with pre-packed electronic components with isolated grounds according to another embodiment. An electrical ground 802 for the high voltage regulator 704 and separate isolated electrical ground 714 for the low voltage regulator 710 are provided. The electrical ground 802 can make use of either a third or fourth metal clip to directly connect to the substrate ground (not shown).

Figures 9, 10:
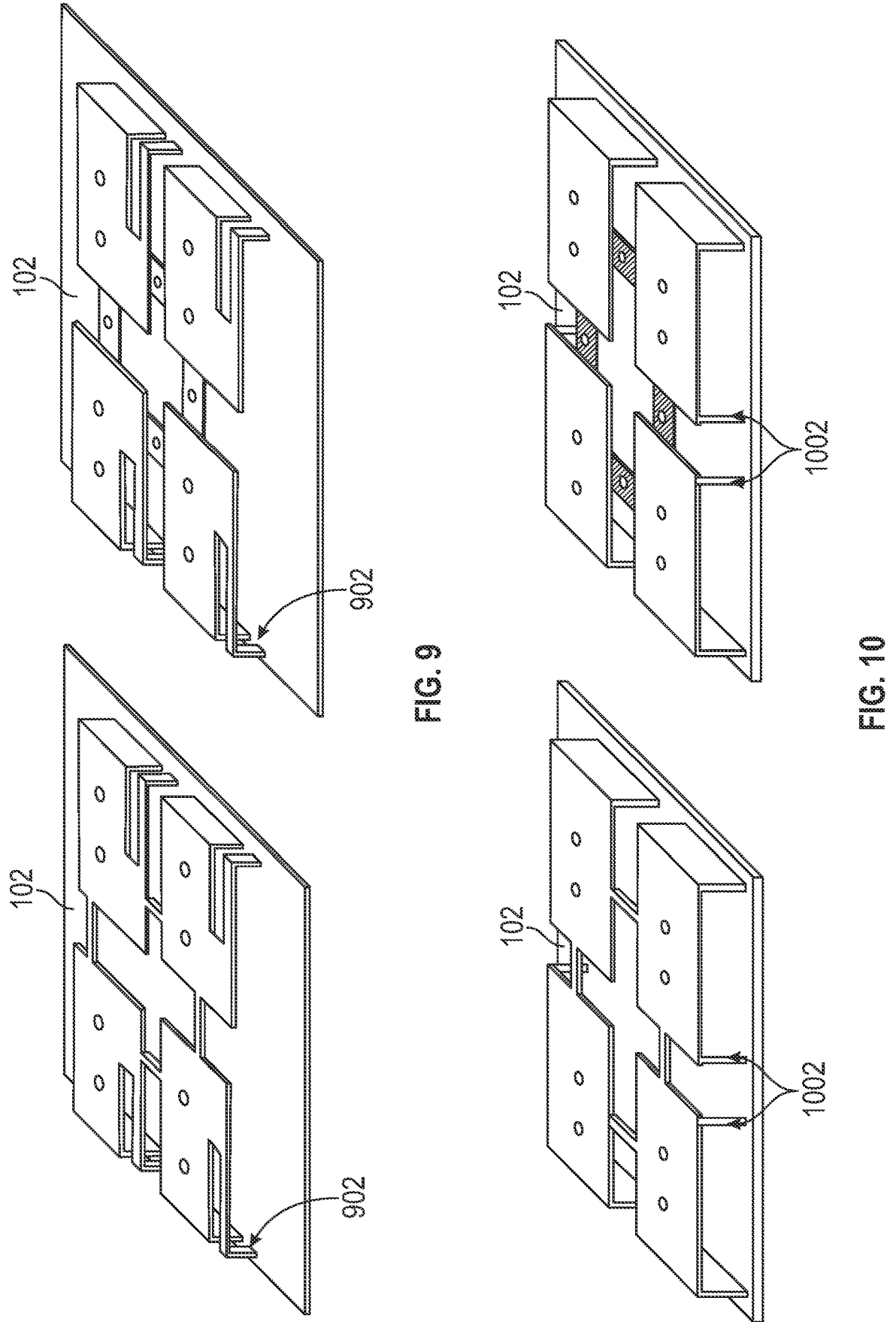
FIG. 9 shows the first example of metal clips with Kelvin sense capability.
FIG. 10 shows the second example of metal clips with Kelvin sense capability.

FIG. 9 and FIG. 10 show examples of multiple metal clips configured with Kelvin sense capability. In a heavy load current mode regulator (buck, boost, or buck-boost), the sub-miliohm inductor current sensing techniques use the inductor DC resistance (DCR) sensing network to calculate the current limit. In applications that offer the digital current readback, Kelvin sensing technique improves the accuracy of current readback. The Kelvin sense arrangement can add one or more additional voltage sensing ("Kelvin-connected") terminals that can be connected to a high-input impedance amplifier. The high input impedance connected to such Kelvin-connected terminals can help reduce or minimize current flow through these Kelvin sense connections. This, in turn, will provide more accurate voltage sensing since there will be less voltage drop caused by minimal current flow through the Kelvin sense connections. Three-terminal or four-terminal sensing can use one or more such Kelvin sense connections, as desired, so as to improve measurement performance accuracy.

The Kelvin sense connection can extend along a dedicated electrical conduction path from one of the metal clips 104a, 104b to a desired location on the substrate 102. As a large current flows through a folded-over region of the conductive material of the metal clips 104a and 104b, less current density (and, therefore, less voltage drop) is present along the dedicated electrical conduction path extending from (1) a location on the folded-over region that is beyond the primary current flow region to (2) the desired Kelvin sense connection point on the substrate 102. Thus, the measurement can be taken at a location on the clip where there is much less—or even no—current density to cause a voltage drop that would otherwise perturb the measurement. Also, if there is a change in electrical resistance of the portion of the metal clip carrying the large current density, the change can be detected using measurement performed at the Kelvin-sense connection.

Kelvin measurements can allow accurate voltage measurements with better immunity to voltage drops caused by parasitic wiring resistance. Having Kelvin sensing capability can help allow for better controlling of a power converter with variable load capacity. The Kelvin sense voltage or current measurements obtained using the Kelvin sense measurement leads 902 or 1002 can be presented to the user, such as in a digital readout of either a voltage or a current measurement. The measurement leads 902 and 1002 can be electrically connected to current or voltage measurement circuitry that can be included in the third circuit package 108.

FIG. 9 shows an example of custom clips with Kelvin sense to provide a substantially separate dedicated electrical measurement pathway to help improve digital readback of a voltage measurement associated with current output through a primary current flow region of the custom clip. The Kelvin sense electrical connection can be at a location of the metal clip that is beyond the primary electrical current pathway carrying the bulk of the current density. In FIG. 9, the Kelvin sense electrical connection can be brought back down to the substrate 102 while still being folded over any component on package 106a or 106b. In FIG. 10, the Kelvin sense readback electrical lead can be brought straight back down to the substrate 102 from a location beyond a region of the metal clip carrying the bulk of the current density.

In some aspects, the techniques described herein relate to an apparatus including: a substrate; a first circuit package, mounted to a first surface of the substrate; a first metal clip mounted on the first surface of the substrate and electrically connected to the first circuit package via a first electrical connector on or in the substrate and folded over the first circuit package; a second circuit package, mounted to the first surface of the substrate; a second metal clip mounted on the first surface of the substrate and electrically connected to the second circuit package via a second electrical connector on or in the substrate and folded over the second circuit package; a first end of a first dielectric support connected to the folded over portion of the first metal clip and a opposite second end of the first dielectric support connected to the folded-over portion of the second metal clip, the first dielectric support providing electrical isolation and bridging mechanical support between the first and second metal clips; and a third circuit package, mounted on and electrically connected to a folded-over portion of the first metal clip and to a folded-over portion of the second metal clip, wherein the folded-over portion of the first metal clip and the folded-over portion of the second metal clip are electrically isolated from each other above the substrate.

In some aspects, the techniques described herein relate to an apparatus, wherein the first dielectric support is connected to a substrate-facing underside of the folded-over portion of the first and second metal clips.

In some aspects, the techniques described herein relate to an apparatus, wherein the third circuit package is electrically connected to both the first metal clip and the second metal clip.

In some aspects, the techniques described herein relate to an apparatus, wherein an insulating transfer molding material is located over the first circuit package and over the second circuit package and under the first metal clip and second metal clip.

In some aspects, the techniques described herein relate to an apparatus, wherein the insulating transfer molding material is located over the first circuit package and over the second circuit package and over the first metal clip and second metal clip; and the insulating transfer molding is located exposing a top surface of the first metal clip and the second metal clip.

In some aspects, the techniques described herein relate to an apparatus, wherein a bend angle of the folded-over portion of the first metal clip and the second metal clip is between 80° up to 90°.

In some aspects, the techniques described herein relate to an apparatus, further including: a fourth circuit package, mounted to the first surface of the substrate; a third metal clip, mounted on the first surface of the substrate and electrically connected to the fourth circuit package via a third electrical connector on or in the substrate and folded over the fourth circuit package; a fifth circuit package, mounted to the first surface of the substrate; a fourth metal clip, mounted on the first surface of the substrate and electrically connected to the fifth circuit package via a fourth electrical connector on or in the substrate and folded over the fifth circuit package; a first end of a second dielectric support connected to the folded-over portion of the third metal clip and a opposite second end of the second dielectric support connected to the folded-over portion of the fourth metal clip, the second dielectric support providing electrical isolation and bridging mechanical support between the third and fourth metal clips; and a sixth circuit package that is mounted on and electrically connected to a folded-over portion of the third metal clip and to a folded-over portion of the fourth metal clip, wherein the folded-over portion of the third metal clip and the folded-over portion of the fourth metal clip are electrically isolated from each other above the substrate and also isolated from the first metal clip and second metal clip.

In some aspects, the techniques described herein relate to an apparatus, wherein the first and second dielectric supports are connected to each other to form a square perimeter in a plane parallel to the first surface of the substrate.

In some aspects, the techniques described herein relate to an apparatus, wherein the first and second dielectric supports include one or more holes in a portion not contacting the first, second, third, or fourth metal clips.

In some aspects, the techniques described herein relate to an apparatus, further including: a third metal clip mounted on the first surface of the substrate and electrically connected to a substrate ground via a third electrical connector on or in the substrate and having a folded-over portion, wherein the folded-over portion of the third metal clip is equal in height to the folded-over portions of the first and second metal clips; and a ground of the third circuit package is electrically connected to the substrate ground via the folded-over portion of the third metal clip, wherein the folded-over portion of the third metal clip is electrically isolated from the first metal clip and from the second metal clip.

In some aspects, the techniques described herein relate to an apparatus, wherein the first metal clip is connected to a voltage terminal of a third circuit package and bypasses the first circuit package; and the second metal clip provides an electrical conduction path for an input voltage to the second circuit package.

In some aspects, the techniques described herein relate to an apparatus, wherein the third circuit package includes a first voltage regulator.

In some aspects, the techniques described herein relate to an apparatus, wherein the first circuit package and the second circuit package are a part of a second voltage regulator on that is mounted to the first surface of the substrate.

In some aspects, the techniques described herein relate to an apparatus, wherein the folded-over portion of at least one of the first metal clip or the second metal clip includes a Kelvin sense measurement lead connected at an end to the folded-over portion of the at least one of the first metal clip or the second metal clip at a location away from current flow through the folded-over portion of the at least one of the first metal clip or the second metal clip and the third circuit package.

In some aspects, the techniques described herein relate to an apparatus, wherein the Kelvin sense measurement lead is at least one of a voltage or current measurement lead.

In some aspects, the techniques described herein relate to an apparatus, wherein the Kelvin sense measurement lead is configured to connect to inductor current measurement circuitry to measure an indication of inductor current of an inductor in the third circuit package.

In some aspects, the techniques described herein relate to a method of manufacturing an apparatus, the method including: adhering a first dielectric support to a folded-over portion of a first metal clip and adhering a opposite second end of the first dielectric support to a folded-over portion of a second metal clip; and soldering to a substrate at least first circuit package and second circuit package, the first metal clip and second metal clip making electrical connection to the first circuit package and second circuit package.

In some aspects, the techniques described herein relate to a method, wherein at least one of the first and second metal clips includes one or more holes in a vertical-portion and on the folded-over portion.

In some aspects, the techniques described herein relate to a method, further including: exposing an edge portion of a top facing side of the first and second metal clips to form a structural step for a molded layer to physically hold the first and second metal clips in place.

In some aspects, the techniques described herein relate to a method, including: using transfer molding to form the molded layer; positioning a packaged electronic component so that a vertical portion of the first and second metal clips does not impede flow direction when forming the molded layer.

The above-detailed description includes references to the accompanying drawings, which form a part of the detailed description. By way of illustration, the drawings show specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof) or with respect to other examples (or one or more aspects thereof) shown or described herein.

In the event of inconsistent usage between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of the subject matter discussed. Moreover, such as may appear in a claim, the terms "first," "second," and "third," etc. are used merely as labels and are not intended to impose numerical requirements on their objects.

Example methods and apparatus are directed to reduce resistance through the connectors while not increasing the complexity of the design. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. However, it will be evident to one skilled in the art that the present subject matter may be practiced without these specific details.

Method examples described herein may be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include but are not limited to hard disks, removable magnetic disks, removable optical disks (e.g., compact disks and digital video disks), magnetic cassettes, memory cards or sticks, random access memories (RAMs), read-only memories (ROMs), and the like.

The above description is intended to be illustrative and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, the inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

The invention claimed is:

1. An apparatus comprising:
a plurality of metal clips including a first, a second, a third, and a fourth metal clip, and individual ones of the plurality of metal clips having vertical portion and folded over portion;
a plurality of circuit packages, including first and second circuit packages mounted to a first surface of a substrate; and a separate third circuit package is mounted on and electrically connected to a folded-over portion of the first metal clip and to a folded-over portion of the second metal clip, wherein the folded-over portion of the first metal clip and the folded-over portion of the second metal clip are electrically isolated from each other above the substrate,
wherein a first metal clip of the plurality of metal clips is connected to a voltage terminal of a circuit package mounted on and electrically connected to a folded-over portion of the first metal clip and to a folded-over portion of the second metal clip and bypasses a first circuit package that is mounted to the substrate; and
the second metal clip provides an electrical conduction path for a voltage to a second circuit package.

2. The apparatus of claim 1, comprising a fourth circuit package mounted on and electrically connected to a folded-over portion of the third metal clip and to a folded-over portion of the fourth metal clip, wherein the folded-over portion of the third metal clip and the folded-over portion of the fourth metal clip are electrically isolated from each other above the substrate.

3. The apparatus of claim 1, wherein an insulating transfer molding material is located over the plurality of circuit packages and under the plurality of metal clips.

4. The apparatus of claim 3, wherein the insulating molding material is located over the plurality of circuit packages and over the first, second, third and fourth metal clips; and
the molding is arranged to expose a top surface of the first, second, third, and fourth metal clips.

5. The apparatus of claim 1, wherein a bend angle of the folded-over portion of the first metal clip and the second metal clip is between 80° up to 90°.

6. The apparatus of claim 1, further comprising:
a ground of the third circuit package that is mounted on and electrically connected to a folded-over portion of the first metal clip and to a folded-over portion of the second metal clip is electrically connected to a substrate ground of at least one of the circuit packages on the substrate via the folded-over portion of the third metal clip, wherein the folded-over portion of the third metal clip is electrically isolated from the first metal clip and from the second metal clip.

7. The apparatus of claim 6, further comprising:
a ground of the circuit package that is mounted on and electrically connected to a folded-over portion of the first metal clip and to a folded-over portion of the second metal clip is electrically connected to an isolated ground via the folded-over portion of the third metal clip, wherein the folded-over portion of the third metal clip is electrically isolated from the first metal clip and from the second metal clip.

8. The apparatus of claim 1, wherein the circuit package mounted on and electrically connected to a folded-over portion of the first metal clip and to a folded-over portion of the second metal clip includes a voltage regulator.

9. The apparatus of claim 1, wherein the first circuit package and the second circuit package are a part of a voltage regulator that is mounted to the first surface of the substrate.

10. The apparatus of claim 1, wherein the folded-over portion of at least one of the first metal clip or the second metal clip includes a Kelvin sense measurement lead connected to the folded-over portion at a location away from current flow through the folded-over portion and the third circuit package.

11. The apparatus of claim 10, wherein the Kelvin sense measurement lead includes at least one of a voltage or current measurement lead.

12. The apparatus of claim 10, wherein the Kelvin sense measurement lead is configured to connect to inductor current measurement circuitry to measure an indication of inductor current of an inductor in the third circuit package.

13. An apparatus comprising:

a plurality of metal clips including a first, a second, a third, and a fourth metal clip, and individual ones of the plurality of metal clips having vertical portion and folded over portion;

a plurality of circuit packages, including first and second circuit packages mounted to a first surface of a substrate;

a separate third circuit package is mounted on and electrically connected to a folded-over portion of the first metal clip and to a folded-over portion of the second metal clip, wherein the folded-over portion of the first metal clip and the folded-over portion of the second metal clip are electrically isolated from each other above the substrate; and a dielectric support having a first end connected to the folded-over portion of the first metal clip and an opposite second end connected to the folded-over portion of the second metal clip, wherein the dielectric support is non-electrically-conductive and provides bridging mechanical support between the folded-over portions while maintaining their electrical isolation, wherein a first metal clip of the plurality of metal clips is connected to a voltage terminal of a circuit package mounted on and electrically connected to a folded-over portion of the first metal clip and to a folded-over portion of the second metal clip and bypasses a first circuit package that is mounted to the substrate; and the second metal clip provides an electrical conduction path for a voltage to a second circuit package.

14. The apparatus of claim 13, wherein an insulating molding material is located over the plurality of circuit packages and under the plurality of metal clips.

15. The apparatus of claim 14, wherein the insulating molding material is located over the plurality of circuit packages and over the first, second, third and fourth metal clips; and the molding is arranged to expose a top surface of the first, second, third, and fourth metal clips.

16. The apparatus of claim 13, wherein a bend angle of the folded-over portion of the first metal clip and the second metal clip is between 80° up to 90°.

17. The apparatus of claim 13, further comprising:

a ground of the third circuit package that is mounted on and electrically connected to a folded-over portion of the first metal clip and to a folded-over portion of the second metal clip is electrically connected to a substrate ground of at least one of the circuit packages on the substrate via the folded-over portion of the third metal clip, wherein the folded-over portion of the third metal clip is electrically isolated from the first metal clip and from the second metal clip.

18. An apparatus comprising:

a plurality of metal clips including a first, a second, a third, and a fourth metal clip, and individual ones of the plurality of metal clips having vertical portion and folded over portion;

a plurality of circuit packages, including first and second circuit packages mounted to a first surface of a substrate;

a separate third circuit package is mounted on and electrically connected to a folded-over portion of the first metal clip and to a folded-over portion of the second metal clip, wherein the folded-over portion of the first metal clip and the folded-over portion of the second metal clip are electrically isolated from each other above the substrate; and a dielectric support having a first end connected to the folded-over portion of the first metal clip and an opposite second end connected to the folded-over portion of the second metal clip, wherein the dielectric support is non-electrically-conductive and provides bridging mechanical support between the folded-over portions while maintaining their electrical isolation.

19. The apparatus of claim 18, wherein an insulating molding material is located over the plurality of circuit packages and under the plurality of metal clips.

* * * * *